United States Patent
Rebstock

(10) Patent No.: US 8,753,063 B2
(45) Date of Patent: *Jun. 17, 2014

(54) REMOVABLE COMPARTMENTS FOR WORKPIECE STOCKER

(75) Inventor: Lutz Rebstock, Gaienhofen (DE)

(73) Assignee: Dynamic Micro Systems, Semiconductor Equipment GmbH, Radolfzell (DE)

( * ) Notice: Subject to any disclaimer, the term of this patent is extended or adjusted under 35 U.S.C. 154(b) by 133 days.

This patent is subject to a terminal disclaimer.

(21) Appl. No.: 13/151,287

(22) Filed: Jun. 2, 2011

(65) Prior Publication Data

US 2011/0236176 A1    Sep. 29, 2011

Related U.S. Application Data

(63) Continuation of application No. 11/881,086, filed on Jul. 25, 2007, now abandoned, which is a continuation of application No. 11/881,087, filed on Jul. 25, 2007.

(60) Provisional application No. 60/859,201, filed on Nov. 15, 2006.

(51) Int. Cl.
   *B65B 21/02*    (2006.01)

(52) U.S. Cl.
   USPC ........... 414/416.03; 414/416.08; 414/938

(58) Field of Classification Search
   None
   See application file for complete search history.

(56) References Cited

U.S. PATENT DOCUMENTS

| | | | | |
|---|---|---|---|---|
| 4,573,851 A | * | 3/1986 | Butler | 414/404 |
| 4,867,629 A | * | 9/1989 | Iwasawa et al. | 414/331.05 |
| 4,923,352 A | * | 5/1990 | Tamura et al. | 414/225.01 |
| 4,986,715 A | * | 1/1991 | Asakawa | 414/331.05 |
| 5,090,972 A | * | 2/1992 | Eller et al. | 95/10 |
| 5,096,477 A | * | 3/1992 | Shinoda et al. | 55/385.2 |
| 5,344,365 A | * | 9/1994 | Scott et al. | 454/187 |
| 5,388,945 A | * | 2/1995 | Garric et al. | 414/217.1 |
| 5,525,106 A | * | 6/1996 | Iizuka et al. | 454/187 |
| 6,142,722 A | * | 11/2000 | Genov et al. | 414/217 |
| 6,516,243 B2 | * | 2/2003 | Chang et al. | 700/217 |
| 6,690,993 B2 | * | 2/2004 | Foulke et al. | 700/218 |
| 6,712,577 B2 | * | 3/2004 | Davis et al. | 414/217 |
| 6,848,876 B2 | * | 2/2005 | Babbs et al. | 414/217.1 |
| 7,198,447 B2 | * | 4/2007 | Morimitsu et al. | 414/217 |
| 7,896,602 B2 | * | 3/2011 | Rebstock | 414/416.08 |

FOREIGN PATENT DOCUMENTS

| | | | | |
|---|---|---|---|---|
| JP | 2003 182815 | | 7/2003 | |
| WO | WO-00/62332 | * | 10/2000 | B65G 1/00 |
| WO | WO 00/62332 | | 10/2000 | |

OTHER PUBLICATIONS

PCT preliminary report on patentability-PCT/IB2007/054657-dated May 19, 2009.

* cited by examiner

*Primary Examiner* — Saul Rodriguez
*Assistant Examiner* — Willie Berry, Jr.
(74) *Attorney, Agent, or Firm* — Tue Nguyen

(57) ABSTRACT

The present invention discloses apparatuses and method for configuring a compartmentable equipment to accommodate emergency responses. An exemplary equipment comprises a plurality of removable compartments for storing workpieces so that in emergency events, such as power failure or equipment failure, the workpieces can be removed from the equipment for continuing processing without disrupting the flow of the fabrication facility. The compartmentable equipment can comprise emergency access ports, including mating interface to a portable workpiece removal equipment to allow accessing the individual compartments without compromising the quality, defects and yield of the workpieces stored in the stocker.

16 Claims, 12 Drawing Sheets

REMOVABLE COMPARTMENTS FOR WORKPIECE STOCKER

This application is a continuation of and claims priority from U.S. patent application Ser. Nos. 11/881,086, and 11/881,087, filed on Jul. 25, 2007, entitled "Removable compartments for workpiece stocker", which claim priority from U.S. provisional patent application Ser. No. 60/859,201, filed on Nov. 15, 2006, entitled "Removable compartments for workpiece stocker"; which are incorporated herein by reference.

FIELD OF THE INVENTION

The present invention relates to semiconductor equipment, and more particularly, to equipment and method to improve fabrication facility processing.

BACKGROUND

Stockers generally are installed within a semiconductor facility for temporarily storing workpieces, such as wafers, flat panel displays, LCD, photolithography reticles, or masks. In the process of manufacturing semiconductor devices, LCD panels, and others, there are hundreds of processing equipments and thus hundreds of manufacturing steps. It is very difficult for the flow of the wafers, flat panels, or LCDs (hereafter workpiece) to be uniform from step to step, from tool to tool. Despite the best planners, there is always the unexpected scenario, such as a tool down, an emergency lot coming through, a periodic maintenance lasting longer than planned, thus there are various accumulations of the workpieces at certain steps for certain tools. The accumulated workpieces will need to be stored in a storage stocker, waiting to be processed.

Further, photolithography process is a critical process in the semiconductor fabrication facility, involving a large number of photolithography masks or reticles (hereinafter reticle). The reticles thus are typically stored in a storage stocker, and being retrieved when needed into the lithography exposure equipment.

The storage of workpieces and reticles (hereafter articles) is much more complicated due to the requirement of cleanliness. Damages to the articles can be physical damages in the form of particles, or chemical damages, in the form of interactions. With the critical dimension of the semiconductor device processing surpassing 0.1 micron, particles of 0.1 micron sizes, and reactive species will need to be prevented from approaching the articles. The storage areas typically would need to be even cleaner than the processing facility, to ensure less cleaning between processing.

Thus the stocker storage areas is typically designed to be sealed off from the outside environment, preferably with constant purging, and even with inert gas flow to prevent possible chemical reactions. Access to the storage areas is load-locked, to ensure isolation between the clean storage environment and the outside environment.

This creates a potential problem in the event of the failure of the stocker, such as a transport malfunction, or a load lock malfunction, the stocker storage becomes isolated, with no way to retrieve articles from the stocker storage. This failure, through the chain reaction, could shut down a large portion of the fabrication facility.

SUMMARY

The present invention discloses apparatuses and method for configuring a compartmentable equipment to accommodate emergency responses. An exemplary equipment comprises a plurality of removable compartments for storing workpieces so that in emergency events, such as power failure or equipment failure, the workpieces can be removed from the equipment for continuing processing without disrupting the flow of the fabrication facility.

In an embodiment, the compartmentable equipment is configured for a stocker for storing semiconductor workpieces such as reticles or wafers. A stocker according to an embodiment of the present invention provides a plurality of removable compartments where the workpieces are stored. Thus in the events of failure, the workpieces can be accessed by removing the appropriate compartments. The compartments are preferably designed for removal without compromising the quality of other workpieces.

In an embodiment, the compartments are open and removable. An exemplary stocker comprises a plurality of open and removable compartments arranged in a shelving configuration, accessible by a robot handling system. The compartments may be arranged in a circular configuration surrounding a radial and rotational robot, or the compartments may be arranged in a linear xy configuration, facing a linear xy robot. Open compartments allow the ease of operations such as picking up or placing workpieces in and out of the stocker without the need for opening the doors of the compartments. The storage of workpieces in compartments allows the quick removal of the individual compartments during equipment failure. The workpieces can also be stored in a container within the compartments.

In an embodiment, the compartments are sealed, preferably individually sealed. Sealed compartments allow the emergency removal without contaminating the remaining workpieces due to the emergency access. Sealed compartments further prevent the cross contamination between compartments, since the compartments are sealed against each other.

In an embodiment, the compartments are open during operations, thus providing improve throughput and ease of accessing the workpieces. In one aspect, the compartments can be sealed when the workpieces are not being accessed. A sealed compartment can be open when needed for accessing the workpieces stored within. Or a controller can keep track of the needed workpieces, and thus can open the sealed compartments just before the compartments need to be opened. In another aspect, the compartments can be sealed during emergency accessing operation. The compartments are opened normally, but are sealed when a failure condition is detected. The compartments can be sealed by automatically or manually sealing the compartments before accessing the emergency operation. In an aspect, the system comprises automatic or manual sealing mechanism for isolating the individual compartments.

In an embodiment, the compartmentable equipment comprises emergency access ports to remove the compartments. The emergency access ports can be positioned at a side of the equipment, either in the front side facing the clean room, or in the back sides facing the equipment chase area. The emergency access ports allow an operator to gain access to the individual compartments to remove them in the events of failure, preferably without compromising the quality, e.g. cleanliness or exposing to contaminants, of other workpieces or other compartments.

In an embodiment, the emergency access ports include mating interface to a portable workpiece removal equipment. During emergency situations, the workpiece removal equipment links to the mating interface of the stocker to allow accessing the individual compartments without compromising the quality, defects and yield of the workpieces stored in the stocker. The workpiece removal equipment can include a portable clean room area, thus allowing forming an integrated clean room extension to the stocker for the transfer of the compartments. In one aspect, the workpiece removal equipment includes a robot handling assembly for accessing the compartments. In other aspect, the workpiece removal equipment includes a loadlock interface for allowing an operator to enter the stocker to remove the compartment. The workpiece removal equipment can also include container boxes for storing the compartments to remove the workpieces out of the clean environment.

The stocker system can include rotatable carousel for accessing all the compartments. The system can also include opening or moving mechanism for accessing inner compartments.

In an embodiment, the system comprises emergency removal equipment to facilitate the removal of the compartments. A compartment can store hundred or so workpieces, thus can be heavy. Further, for small footprint, the compartments might be stacked several shelves high, and thus it is difficult for human access.

In an embodiment, the system comprises air flow configuration for maintaining cleanliness for the compartments. The air flow can cover the common area as well as the inside of the compartment.

BRIEF DESCRIPTIONS OF THE DRAWINGS

DETAIL DESCRIPTIONS

Figure 1:
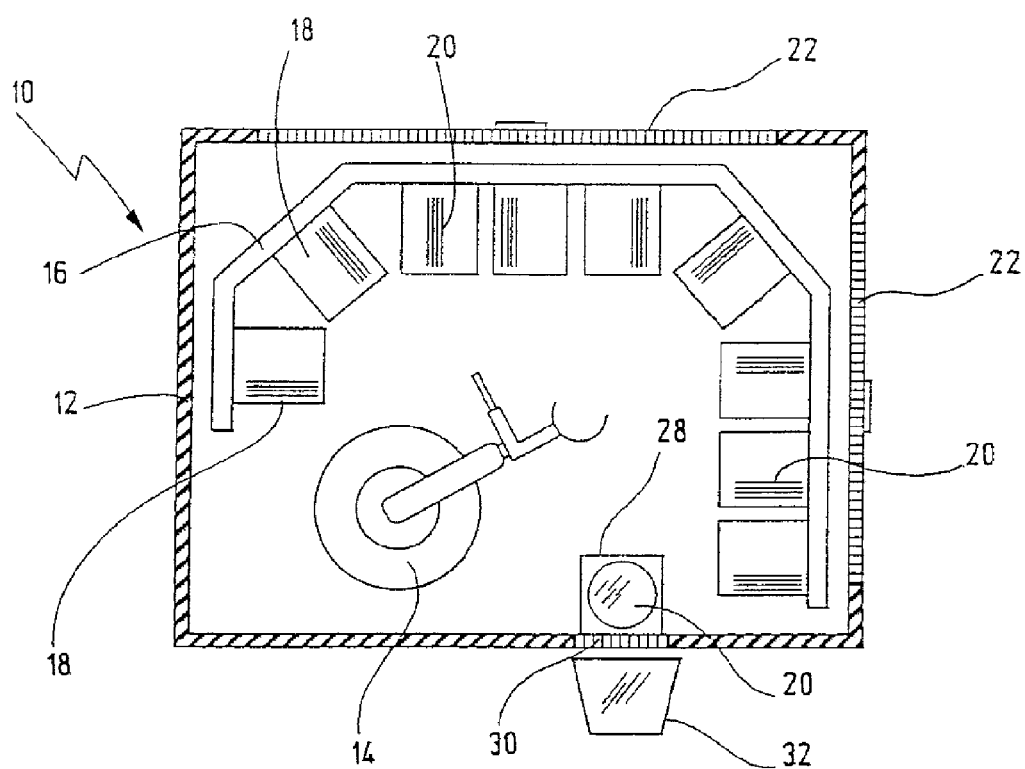
FIG. 1 shows an exemplary embodiment of the stocker according to the present invention.
Figure 2:
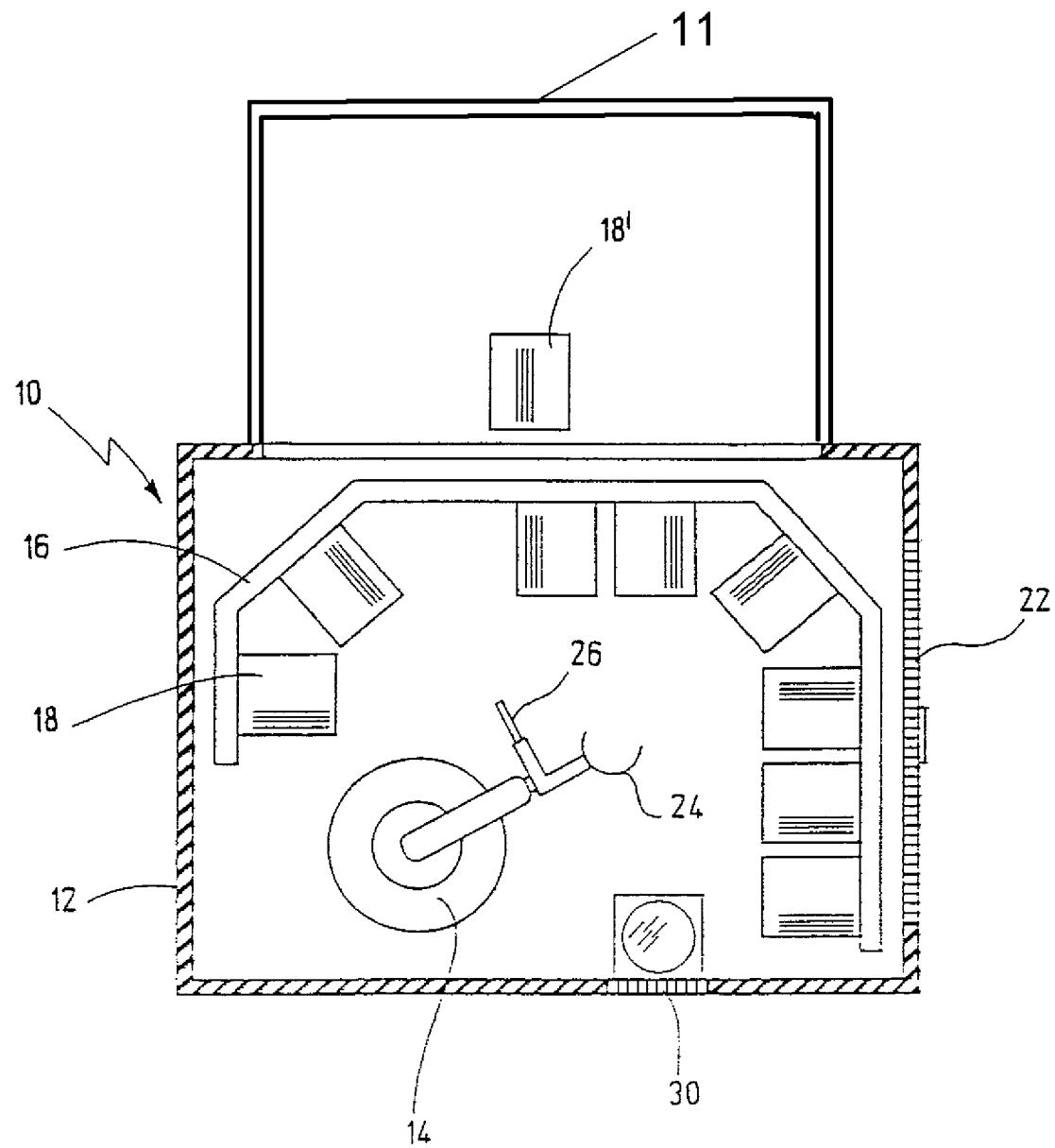
FIG. 2 shows an exemplary stocker with opened door for the manual withdrawal of a container.

During the processing of semiconductor workpieces in the manufacture of microelectronics, different equipments are employed for several hundred processing steps. The process flow of a workpiece is essential serial, with most of the tools operate on the workpieces one at a time. The failure of any link in the fabrication process would severely disrupt the process flow, resulting in loss of manufacturing productivity. The present invention relates to an apparatus and method for improving reliability with moving equipment, involving emergency accesses for the stored workpieces in an equipment to ensure continuous flow of workpieces for a fabrication facility.

In an exemplary embodiment, the present invention provides the handling or movement of workpieces in a manner which assured a continuous flow of workpieces within an equipment and within a fabrication facility, even in the event of part failures. The present invention discloses an emergency mechanism for prevent equipment failure from affecting the process flow. In one aspect, the present invention discloses a management methodology and apparatuses to a fabrication equipment so that in the event of the failure of that particular fabrication equipment, it still can support the operation of the fabrication facility while waiting for repair.

The present invention thus provides, in an exemplary embodiment, apparatuses and method for configuring a compartmentable equipment to accommodate emergency responses. An exemplary equipment comprises a plurality of removable compartments for storing workpieces so that in emergency events, such as power failure or equipment failure, the workpieces can be removed from the equipment for continuing processing without disrupting the flow of the fabrication facility.

In an embodiment, the compartmentable equipment is configured for a stocker for storing semiconductor workpieces such as reticles or wafers. A stocker is usually designed for temporary storing the workpieces, thus the flow of the fabrication facility would be severely affected if the stocker is temporary out of service, preventing access of the needed workpieces. A stocker according to an embodiment of the present invention provides a plurality of removable compartments where the workpieces are stored. Thus in the events of failure, the workpieces can be accessed by removing the appropriate compartments. The compartments are preferably designed for removal without compromising the quality of other workpieces.

In an embodiment, the compartments are open and removable. An exemplary stocker comprises a plurality of open and removable compartments arranged in a shelving configuration, accessible by a robot handling system. The compartments may be arranged in a circular configuration surrounding a radial and rotational robot, or the compartments may be arranged in a linear xy configuration, facing a linear xy robot. In this configuration, the robot handler can be designed with three degrees of freedom, e.g. radial, rotational and vertical movements, thus can have improved speed and throughput. Three degree of freedom robots are well established with minimum particle generation, thus this configuration can provide cleanliness for workpiece storage. In addition, the stocker storage area is stationary with the movable components are the robot assembly, thus further contributing to the cleanliness of the storage stocker.

In an embodiment, the stocker configuration provides an open storage area with the workpieces stored bare for easy access. The storing of bare workpieces provides fast access, space saving and ease of clean air purging. The storage area can be configured with a plurality of open compartments, arranging surrounding a robot handling assembly, also in the vertical direction. Open compartments allow the ease of operations such as picking up or placing workpieces in and out of the stocker without the need for opening the doors of the compartments. The storage of workpieces in compartments allows the quick removal of the individual compartments during equipment failure. The workpieces can also be stored in a plurality of containers within the compartments.

In an embodiment, the stocker configuration provides the storage of the workpieces in a highly dense configuration, in either vertical or horizontal positions. The stocker provides a circumferential edge gripper robot handling assembly, approaching and picking up the workpieces from the circumferential edges, thus allowing the dense workpiece storage configuration.

The stocker according to an exemplary embodiment of the present invention is designed for storing contamination-sensitive articles such as semiconductor wafers, and reticles. The stocker designed is particularly configured for space-saving storage and flexible handling. The stocker, in particular, is well suitable for storing a large number of 300 mm or larger wafer on a small storage space under clean conditions.

The open storage can be partitioned into carrier racks or shelves to reduce the risk of cross contamination. The compartments can be removably fastened to carrier racks or shelves, and can include storage containers. The stationary of the carrier racks, the storage containers, the compartments and the articles prevent particles generated from motions, thus substantially reducing the risk of particles generated by abrasion, movement and cross contamination air flow.

The storage compartments and the storage containers are preferably shaped as an open, box-like container, where the robot handling unit can be adapted optimally to inserting and taking articles out of the storage compartments or containers. In a preferred embodiment, the compartments or containers are designed for highly dense storage of articles, for example semiconductor wafer with a pitch distance of less than 5 mm, preferably about 2.5 mm or less. The storage compartments or containers are arranged in a shelving configuration surrounding the robot handling unit, and preferably approximately circular. The storage compartments or containers can also be arranged in a x-y array, with the shelves openings facing a robotic mechanism for transferring the articles. The stationary stocker comprises a plurality of vertically and horizontally spaced shelves each for storing a plurality of articles. The shelves can also designed for storing a plurality of compartments or containers where the articles are stored within.

This configuration can provide space-saving arrangement and at the same time high storage capacity. In addition a very fast accessing of stored articles can be possible in this configuration. The particularly preferred configuration of circular arrangement of the storage containers is well suited with a three degree of freedom robot such as a SCARA robot. The robots includes articulated arms, mobile in a horizontal plane with rotational and radially to a center point. The robot can also be a six axis robot.

Robot assemblies are an important component in automation, especially in manufacturing facilities and manufacturing equipments. For example, in the semiconductor industry, robot arms are used to handle semiconductor wafers, flat panel display, LCD, reticles, masks, or carrier boxes.

In the semiconductor fabrication facility, robot can be used to transport workpieces, typically stored in carrier boxes, from one location to another location, from one equipment to another equipment. In a process system, a robot is typically used to remove the workpieces from the carrier boxes, and then loaded into a loadlock. Another robot can be used to move the workpiece from the loadlock into a processing chamber, and from one processing chamber to another processing chamber. Thus within a processing system, there might be a plurality of robots, each one is designed for a particular task. The processing system could be a deposition system, an etch system, a lithography system, a metrology system, an inspection system, an implantation system, a treatment system, or any workpiece processing system.

Generally speaking, robot handling assembly is different for vacuum system and atmospheric system. The stocker, designed for storing the workpieces until needed, is typically an atmospheric system where a robot is typically used to remove the workpieces from the carrier boxes, and then loaded into a loadlock. Another robot can be used to move the workpiece from the loadlock into a storage chamber, where the workpieces are stored without the original carrier boxes. For box stocker system, the workpieces are stored together with the carrier boxes, without the need for removing them out of the carrier boxes.

The robot mechanism can comprises articulate arm joints to move an article or a container into and out of the stationary stocker. Further, the robot arm assembly comprises a flexible multiple-link mechanism, designed to reach the shelves of the stocker. The arm assembly can have independent radial and rotational movements to reach the arranged spaces of the stocker.

The stocker of the present invention can provide storage compartments or containers forming approximately a substantially circular cabinet around a robot handling device. The robot assembly is preferably stationary, with articulate arm joints reaching the inner side of the stationary stocker to transfer articles.

The robot handling unit includes vertical movement to access the vertical storage compartments or containers. The stocker can also include a second handling unit for transferring the articles into or from the compartments or containers. The stocker can include backside doors for accessing the back of the article containers. The back doors allow access to the articles in emergency events, such as a system crash. The stocker can include a blower for producing a continuous clean gas flow toward the containers, and preferably blowing contamination efficiently downward.

In one embodiment, the present invention discloses an emergency system for emergency retrieval of stored workpieces. The emergency system comprises an emergency access to allow the retrieval of the articles even when there is a general failure. The emergency access can be an emergency door, preferably at the front side, or an equipment access that is not normally use such as an access used by a robot handling in the normal operation. The emergency access can be handled by an operator, or by an external handling equipment. The external handling equipment is preferably independent to be able to operate even with a general failure.

The emergency system is generally designed for robotic access, thus can be very compact with minimum spare volume. The emergency system can also be designed for operator access, comprising an interface for a load lock entrance.

The emergency system is designed for emergency transfer to process equipment, thus should be designed with contamination concerns accordingly. Thus in general, the emergency system is treated like an IO loader with respect to the issue of transportation. For example, the articles stored in the output buffer is preferably stored in the form that can be handled or transported in a clean room environment, as in the case of the articles stored in the IO loaders. Thus the articles are preferably stored in carrier boxes, so that there is no contamination or damage to the articles during the transfer to the needed tools. The carrier boxes can be designed for operator handling, or for OHT handling.

The storage system, such as workpiece or reticle stocker, generally comprises a storage area with an IO loader section, communicated by a robotic handling system. The storage area is preferably cleaner than the outside environment, and therefore the storage system preferably comprises a load lock linking the storage area to the IO loader. The storage area can store the articles in their bare form (e.g. only the article is stored), in their transfer form (e.g. inside carrier boxes), or in their storage form. The storage form is typically between bare and transfer forms, providing better coverage and protection than the bare form, but not as much as the transfer form.

The storage form also can provide emergency protection to the articles in the storage area, in the event of the environmental breach. In the failure of e.g. clean air flow, the articles stored in bare form in the storage area can be all contaminated. A storage form can prevent the contamination. The storage form can be much simpler than a transfer form, since the storage form is not designed for transportation. Thus storage in storage form is much more cost effective than storage in transfer form.

An exemplary stocker 10 is shown in FIG. 1. The stocker 10 includes a housing 12, containing a robot handling unit 14 and a carrier rack 16 to support a plurality of article compartments (or containers) 18. The housing 12 surrounds the robot handling unit 14, the carrier rack 16 and the compartments 18 to form complete enclosure for a clean environment. The top of the housing can be provided with blower and filters (not shown) to produce within the housing 12 a flow of clean air from the top to the bottom. Each compartments 18 is designed to store a plurality of contamination-sensitive articles. In a preferred embodiment, the articles are semiconductor wafers, which can be stored vertically in the compartments 18. In an exemplary embodiment, each compartments can hold 100 wafers of 300 mm. The distance between the stored wafers can be a little as 2.5 mm. The robot handling unit 14 can be a radial, rotational and vertical robot, or can be a 6-axis robot, located in a corner of the housing 12. The carrier rack 16 with the compartments 18 is forming a C-shape surrounding the robot handling unit 14. The stocker 10 can further comprise a pre-aligner 28 for aligning a wafer 20. The wafer 20 can be taken in and out of the pre-aligner 28 by a door 30, connected to a FOUP 32.

The exemplary stocker 10 comprises an emergency access port 22 for accessing the compartments (or containers) 18. The emergency access port 22 is positioned at the backside of the stocker 10, and provides an interface to the clean environment of the stocker. The interface can be mated to a portable workpiece removal environment 11, which can act as a loadlock to allow the transfer of individual compartments or containers 18 out of the stocker without compromising the quality of the remaining workpieces.

The emergency access port 22 can include a mating interface so that an enclosure 11 can link to the stocker 10, providing a clean interface between the stocker and the outside environment. During emergency situation, a portable mini-environment can link to the stocker through the interface of the emergency access port 22 to allow accessing the workpieces or compartments in the stocker, or to put the workpieces or compartments into another suitable container 18' for bringing out of the stocker.

In one aspect, the portable enclosure 11 provides a load lock to the inside of the stocker, equipped with clean room air purging or exhausting. An operator can enter the portable enclosure 11, and becomes clean through a few purging and exhausting cycles of the enclosure 11 before opening the emergency access port 22. The enclosure 11 now becomes a clean room extension to the stocker, allowing the operator to access the individual workpieces in the stocker without contaminate the remaining workpieces. The operator can carry tools and carrier boxes to access the workpieces and the compartments. The workpieces or the compartments can be removed from the stocker and put into a clean room carrier box to be carried out of the stocker and the enclosure. With the compartments 18 storing a plurality of workpieces (e.g. 50 to 100), removing and storing the compartments in a carrier box is much quicker than accessing individual workpieces. The carrier boxes are sealed, thus can be taken out of the stocker to the outside environment, and returned to the facility for processing. Other equipment can be utilized for transfer the workpieces from the carrier boxes to the destination in a clean environment.

In other aspect, the operator remains outside the portable enclosure and operates suitable equipment in the enclosure to collect the workpieces and the compartments, together with putting them into suitable carrier boxes. The equipment can be a robot handling assembly or a glove box. To access the vertical dimension, vertical lift can be incorporated, either inside or outside of the enclosure.

Thus an open compartments stocker according to an embodiment of the present invention comprises an emergency access port and/or a mating interface with a portable clean environment for emergency access the workpieces. Storing the workpieces within open compartments allows fast access, and the emergency access allows access to the workpieces or the compartments during equipment failures.

Figure 3:
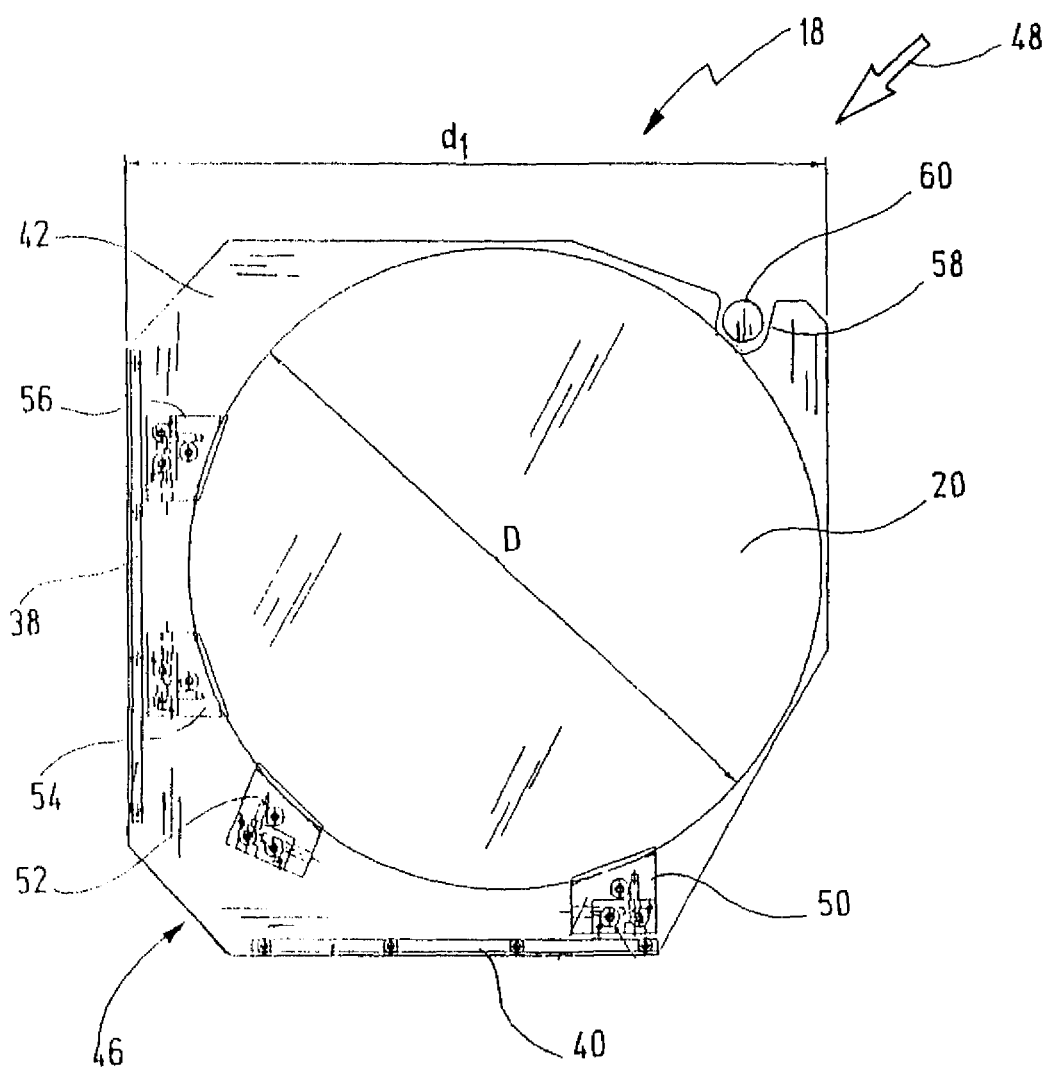
FIG. 3 shows a cross section of a container for a stocker (line III-III in FIG. 4).
Figure 4:
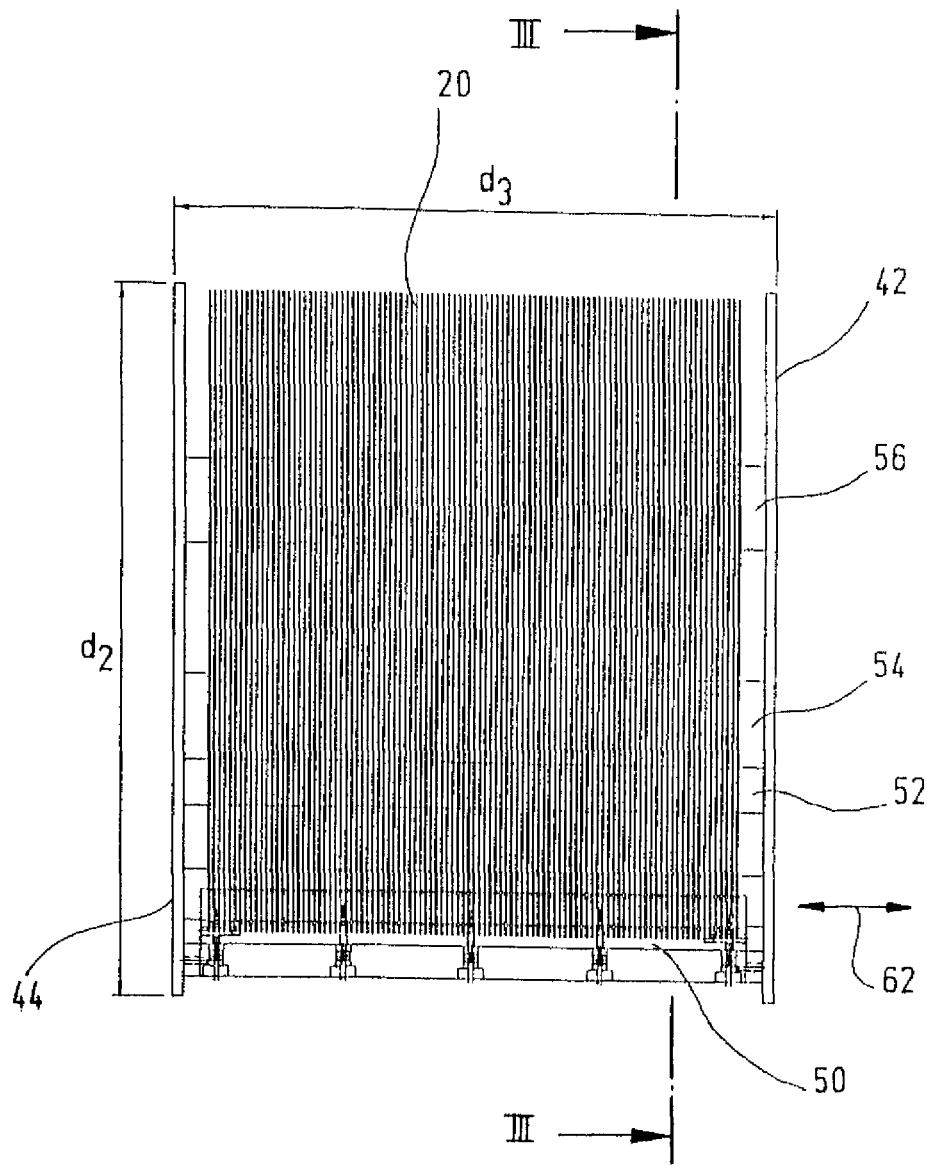
FIG. 4 shows another view of a container.

FIGS. 3 and 4 show an exemplary embodiment of a compartment 18, which includes a rear wall 38, a bottom wall 40 and two side panels 42, 44. The rear wall 38 and the bottom wall 40 preferably provide an opening for releasing clean air flow diagonally across the wafer 20. The air flow 48 between the individual wafers 20 passes through and ensures that any existing particles and foreign matter are removed diagonally downward from the container 18.

Within the compartment 18, four comb like-components with splits 50, 52, 54, 56 are arranged. The split 50-56 are arranged to hold a wafer by its down and back side to permit the removal of the wafer with the robot handling unit 14.

At the upper corner area, there exists a recess 58 to insert a retainer 60. The retainer 60 is designed to hold the wafers in place during movement of the container 18. Each compartment 18 may have a handle (not shown), which is connected with the retainer 60, so that a withdrawal of the container 18 is only possible if the retainer 60 is inserted in the recess 58.

Figure 5:
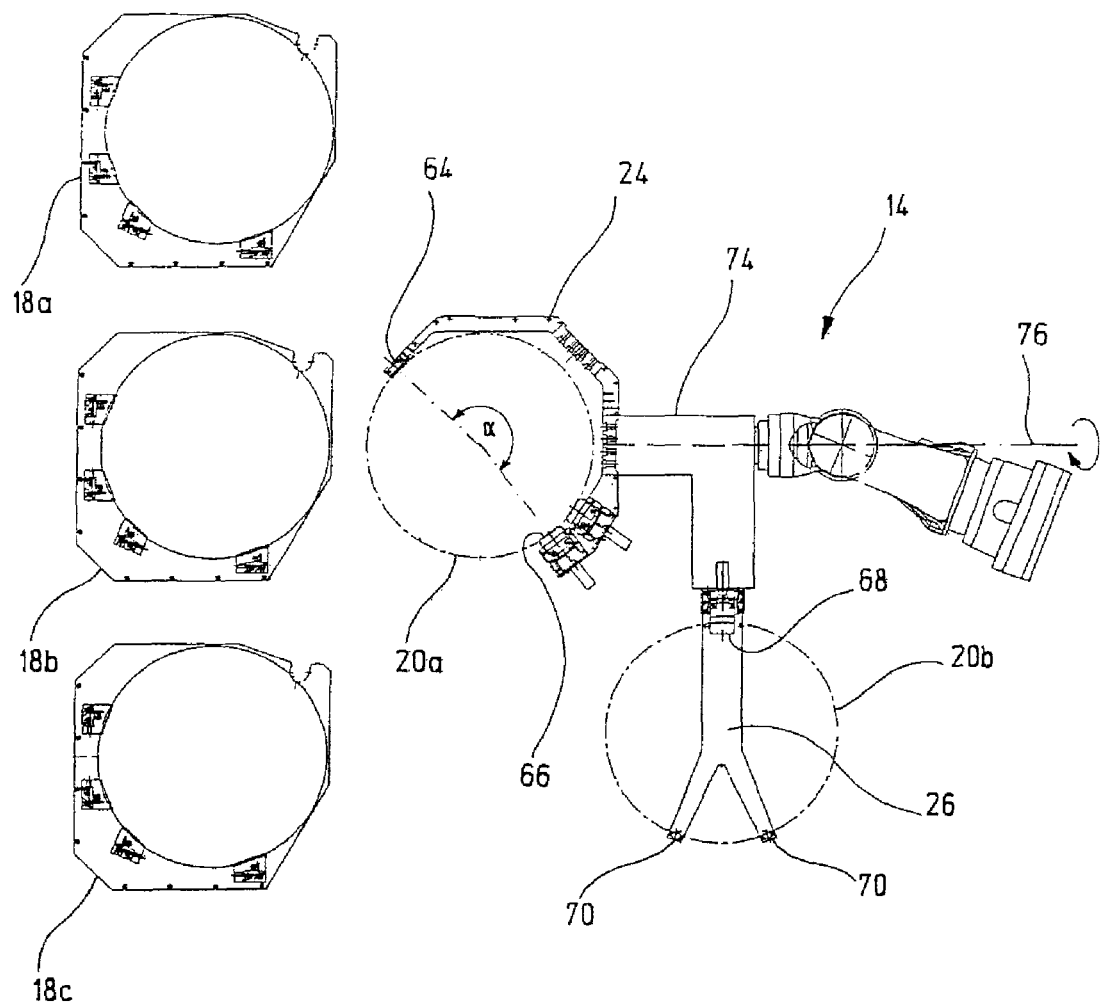
FIG. 5 shows a top view of a robot handling assembly unit.
Figure 6:
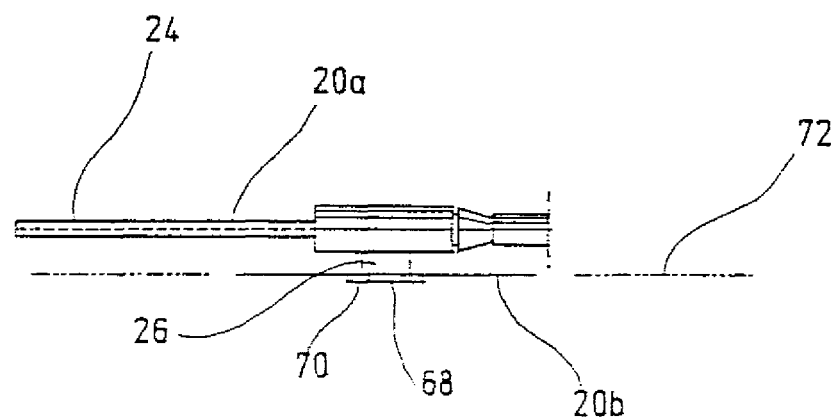
FIG. 6 shows a side view of a robot handling unit.

FIGS. 5 and 6 show an exemplary robot handling unit according to the present invention. The integrated grip arm 14 possesses a first gripper arm 24 and a second gripper arm 26. The first gripper arm 24 is designed as a grip arm, where a wafer 20a can be seized at the edges in a vertical position. The grip arm 24 surrounds the wafer 20a at its outer circumference in an exemplary C-shaped. Two grip elements 64 and 66 are arranged at the free ends of the grip arm 24. The grip arm 24 surrounds the wafer 20a along a circular arc "alpha" of more than 180°. The grip elements 64, 66 can hold the wafer 20a therefore without firm wedging and essentially alone due to gravity. For the pick up and placement of a wafer 20a in a carrier box 18, the grip elements 64, 66 can be opened. In this figure, only the grip element 66 is mobile.

The second gripper arm 26 comprises a Y-shape arm with grip elements 68, 70 at the ends. The gripper arm 26 is holding a wafer in different plane 72 than the gripper arm 24. A wafer 20b is held by the grip elements 68, 70 in the plane 72. The gripper arm 26 has a free end, thus can enter a FOUP to pick up or placing a wafer.

The grippers 24 and 26 are arranged at the free ends of an L-shaped arm segment 74 of an integrated grip arm 14. The arm segment 74 can be swiveling around an axle 76, which lies coaxially to a leg of the arm segment 74, where the gripper 24 is located. This arrangement makes it possible to take and by a 90° rotation around the axle 76, bringing a wafer 20a into a horizontal position out of a vertical position from the carrier box 18. The integrated grip arm can then transfer the wafer to a horizontal station. The integrated grip arm then switches gripper, and the gripper 26 can pick up the wafer and transfer to a FOUP. Wafers from the FOUP can be brought into the carrier box 18 by reverse operations. The integrated grip arm thus can provide movement of the wafers from a FOUP to the storage area with the grippers 24 and 26.

The stocker 10 can provide random access to the stored wafer, thus can eliminate the need for a sorter. In particular, the robot handling unit 14 is capable of selecting wafers 20 from arbitrary containers 18 into a FOUP 32. The stocker 10 thus can be integrated with a FOUP front end loader. Due to the vertical storage and the associated high density storage arrangement of the wafers, the stocker can achieve high storage capacity with small footprint. The storage of the individual wafers in open, separate, box shaped compartments ensures that cross contamination between different wafers 20 is difficult despite the open storage configuration.

Figure 7:
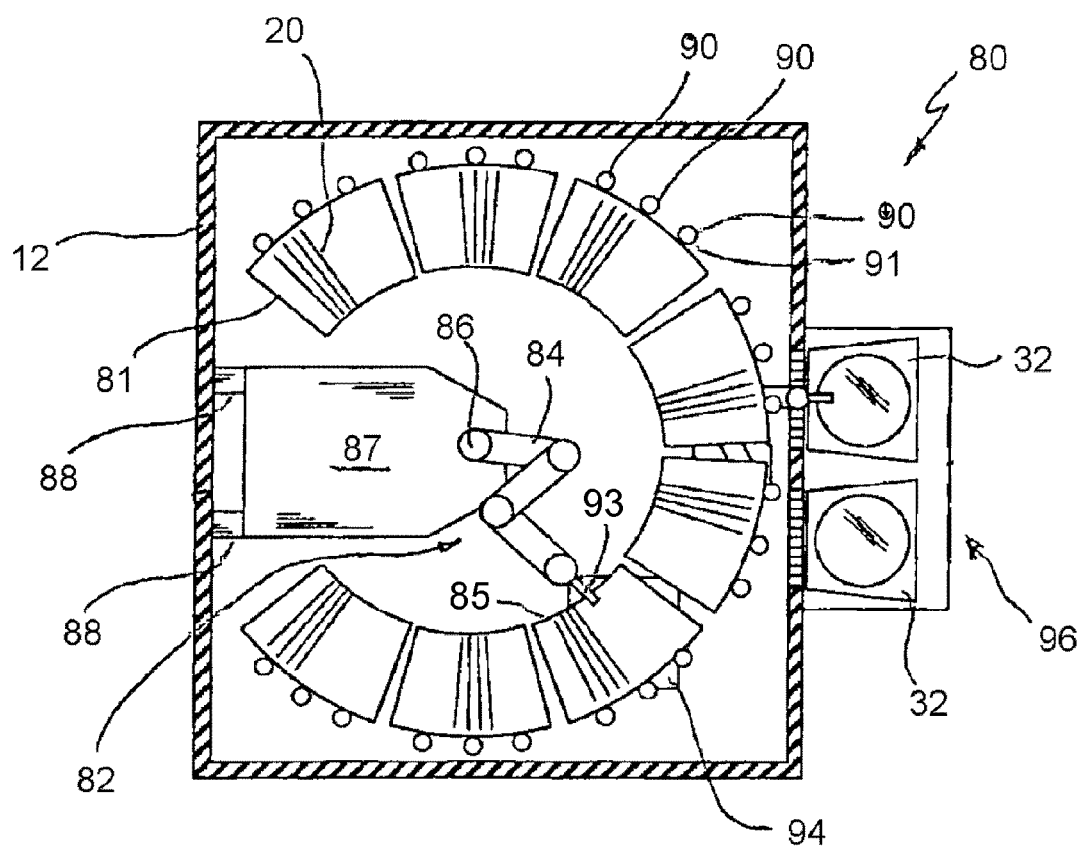
FIG. 7 shows another embodiment of the stocker according to the present invention, top view.
Figure 8:
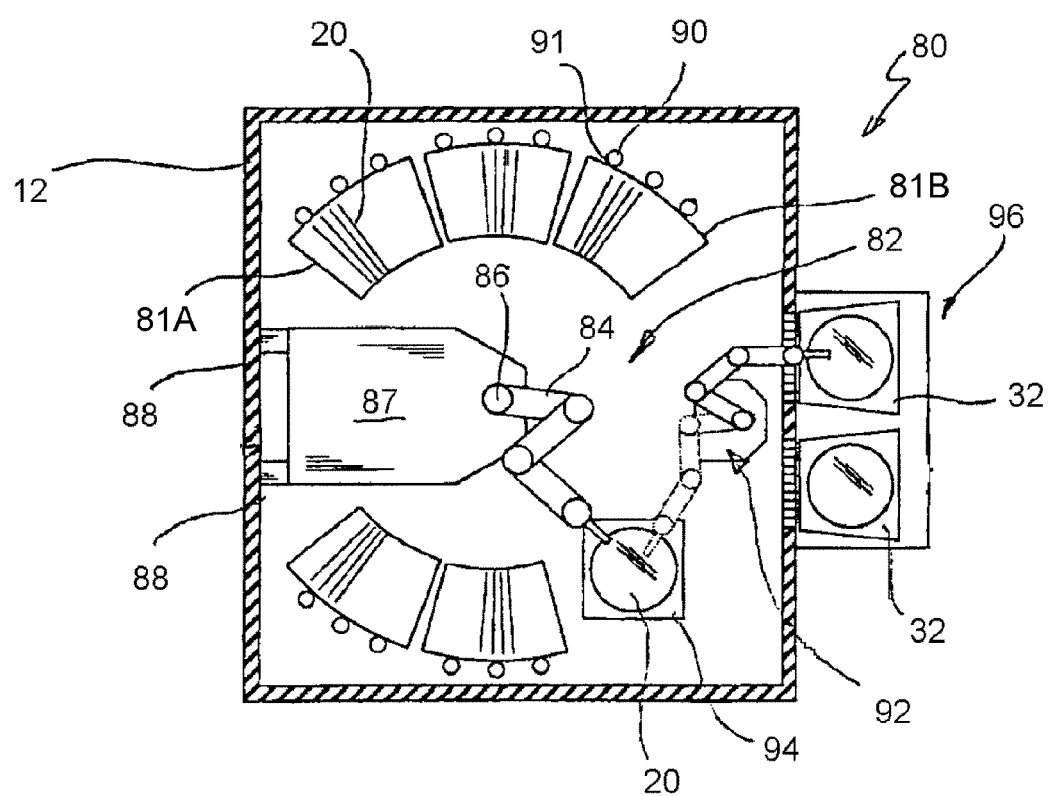
FIG. 8 shows another embodiment of the stocker according to the present invention, top view.

FIGS. 7 and 8 show exemplary embodiments of the present invention stocker 80, comprising a plurality of compartments 81 surrounding a robot handling unit 82 in a circle. The handling unit 82 is depicted with a SCARA robot with an articulate arm 84, that can move radially in a horizontal plane parallel to the view level. The articulate arm 84 is swiveling around a center point 86, which defines a circular arrangement of the containers 81. Thus the articulate arm 84 can provide movements within the horizontal plane, radially and rotationally to the center point 86. The articulate arm 84 is arranged pick up and to place articles 20 in radial direction in and out of containers 81.

Figure 9:
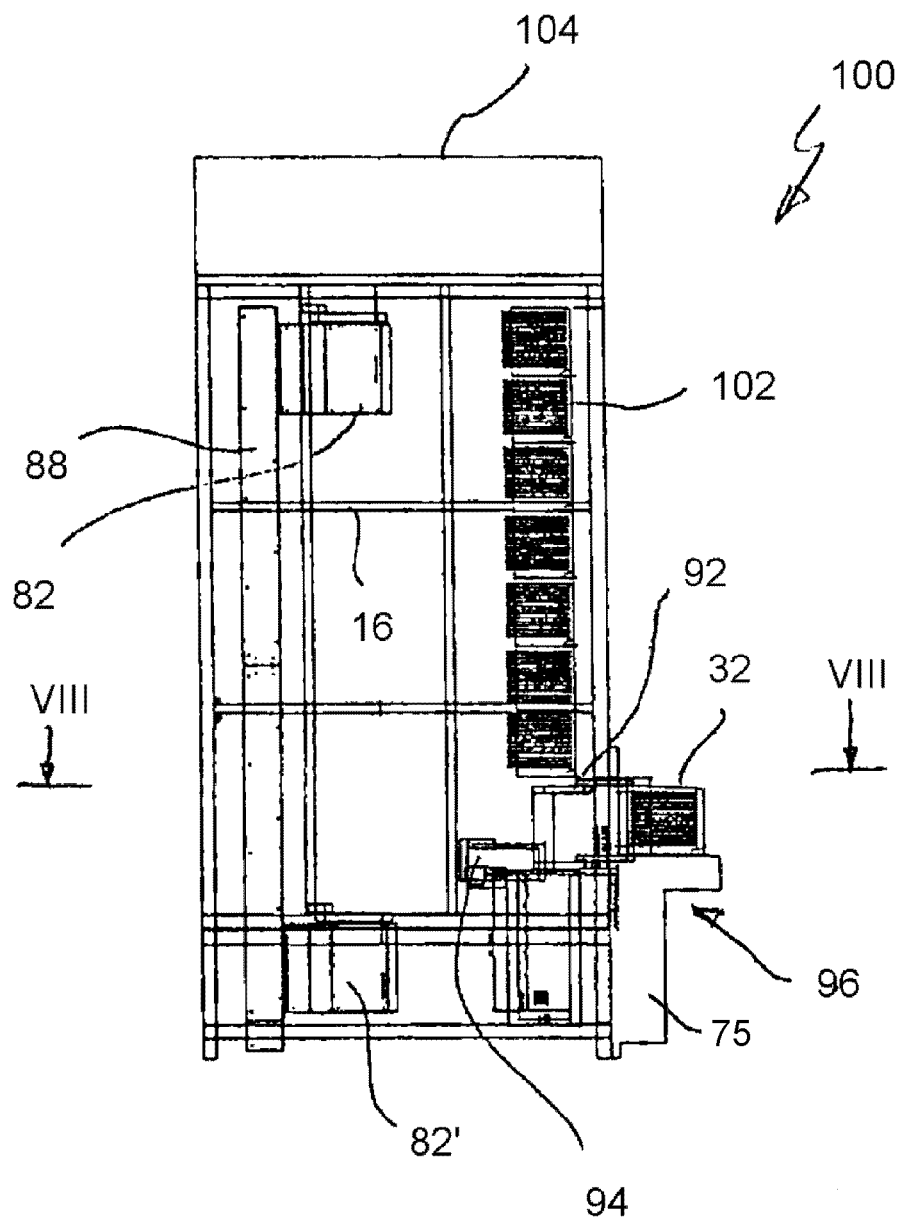
FIG. 9 shows a side view of an exemplary stocker with two robot positions.

FIG. 8 is a plan view on the exemplary stocker 80 along a cutting plane, e.g. the cutting plane VIII-VIII from corresponding FIG. 9. In this plane, some containers 81 are missing from the circular arrangement. In these spaces, a second handling unit 92 and a Prealigner 94 can be provided.

The robot handling unit 82 is designed to transfer a wafer from a compartment 81 to the Prealigner 94. In addition the robot handling unit 82 can rotate the wafer, taking a vertical stored wafer in the compartment 81 to a horizontal stored wafer position on the Prealigner 94. The second handling unit 92 can be used to transfer the wafer from the Prealigner 94 to the FOUP 32. It is preferable that the load lock station 96 possesses a hermetic connection to the housing 12, so that the wafer 20 can be transferred into the FOUP 32 contamination-free.

The second handling unit 92 can also be a robot with an articulate arm, radially movable to a center point to move the wafer between the Prealigner and the FOUPs. The load lock input/output station 96 can include two FOUP 32. This configuration can provide the functionality of a sorter, providing the means to relocate and sort wafers 20 between two FOUPs 32.

Figure 10:
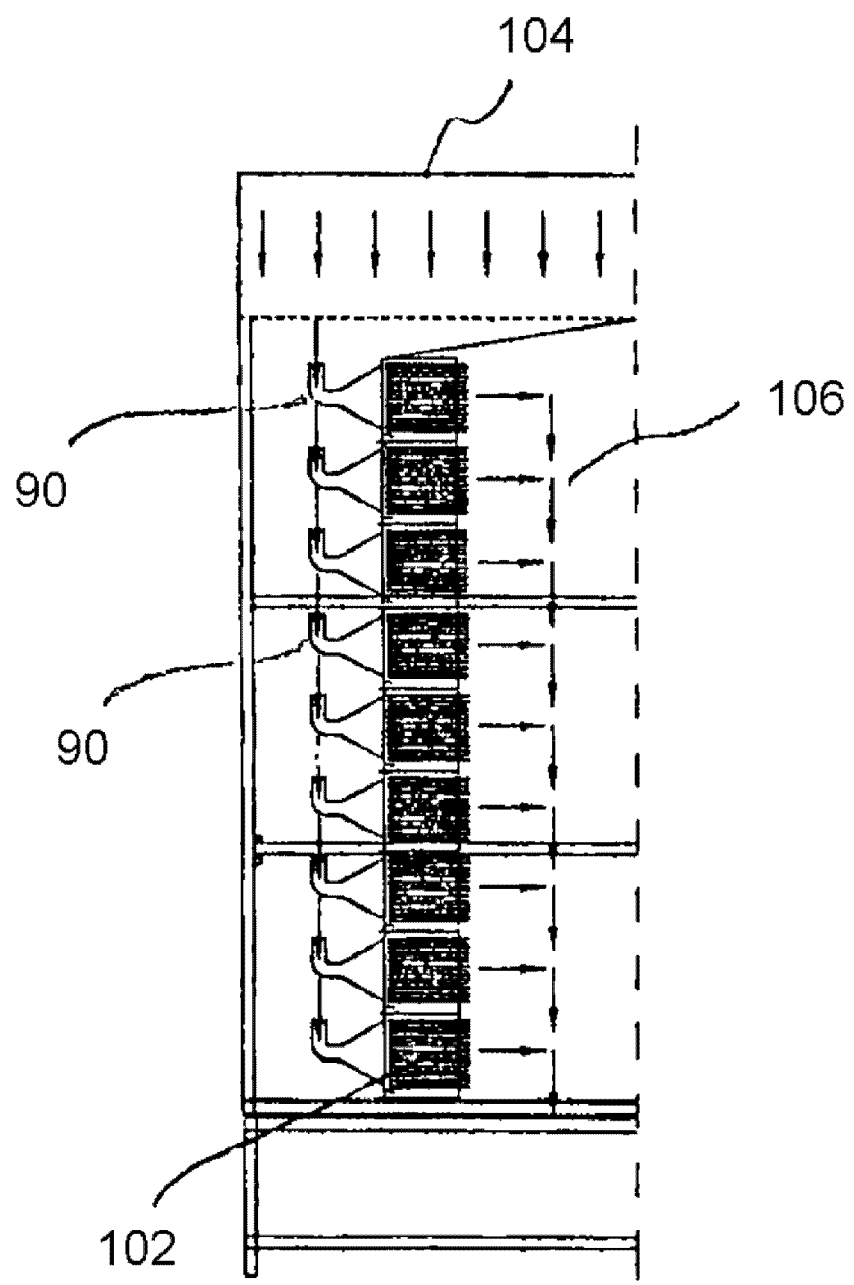
FIG. 10 shows a side view of an exemplary stocker with clean gas flow configuration.
Figure 11:
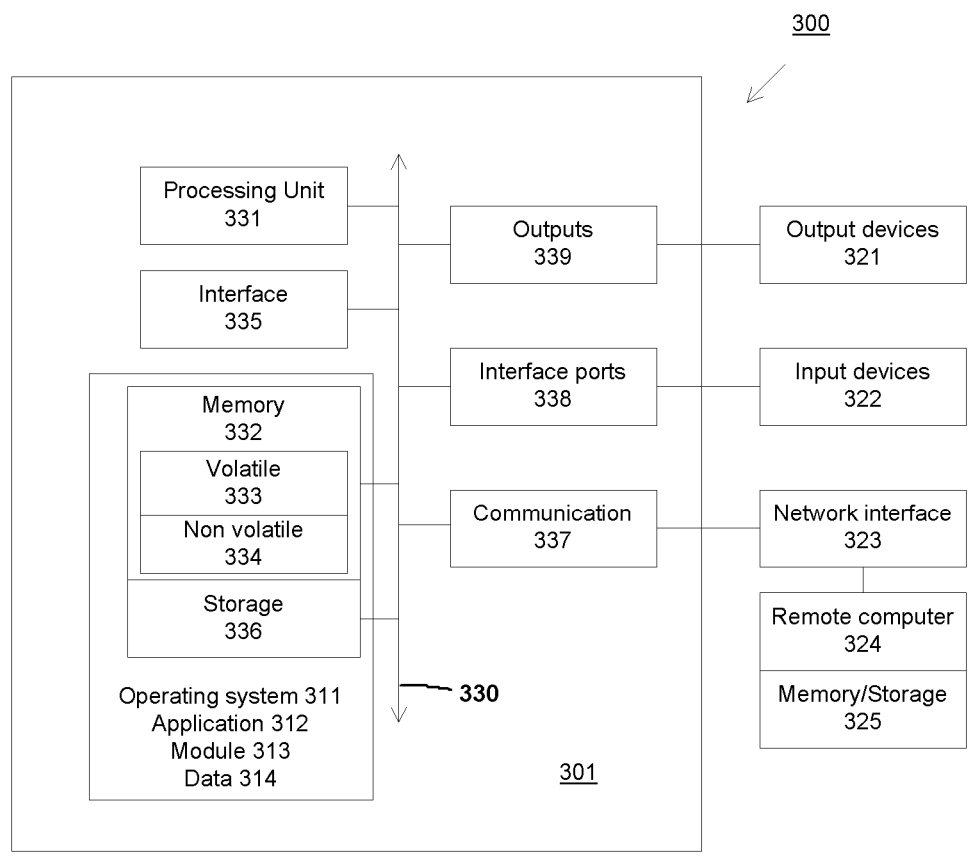
FIG. 11 shows an exemplary computer system for the present invention.
Figure 12:
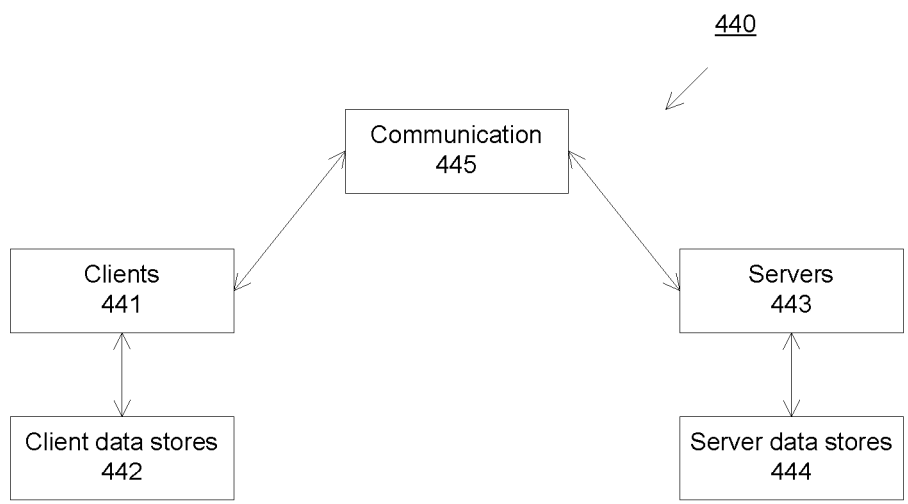
FIG. 12 shows an exemplary computer environment for the present invention.

FIGS. 9 and 10 show an exemplary arrangement of the compartments 81 in the vertical direction. The handling unit 82 can achieve the different vertical levels of the compartments 81 by moving along two guide rails 88 in vertical direction (perpendicular to the view level). The compartments 81 in this exemplary stocker include connections 90 for flowing cleaning gas. Connections 90 are arranged at the back of the compartments 81, so that the cleaning gas flushes the compartments 81 from the back to the front. In addition each connection 90 can include valve 91 for selectively opened or closed. It is thus possible to flush the compartments individually with cleaning gas.

FIG. 9 shows the compartments 81 arranged one above the other and in a circle around a handling unit 82. In FIG. 9, the wafers 20 are stored in horizontal position in the compartments 102. With horizontal storage of the wafers, the handling unit 82 does not have to turn the wafers 20 when taking in and out of the compartments. The robot handling unit 82 is shown in two vertical positions, a top position numbered 82 and a bottom position numbered 82'.

FIG. 9 also shows a blower and a filter unit 104 to provide a cleaning gas, preferably filtered clean air, to the interior of the housing 12. The blower and filter unit 104 receive ambient air, which is cleaned and dried and then flown afterwards into the interior of the housing. In FIG. 10, the cleaned air is flown over connections 90 at the back of the individual compartments 102. The air flow and the cleaning gas thus flow from the back of the compartment 102, out to the opened front and then downward 106. As discussed above, this flow provides a nozzle effect for the vertical storage, thus strengthens the cleaning efficiency. A good flow can also be achieved with the horizontal storage, as presented in these figures. Alternatively, the flow can be from the inside outward.

The stocker is a stationary stocker, provided with a robot handler, movable in the vertical direction (upward and downward) and in the rotational direction. The stocker is provided with a plural number of shelves for storing articles and positioned inward, for transferring articles between a loadlock station and the stationary stocker.

The robot assembly further comprises a plurality of sensors, such as workpiece positioning sensors, image sensing of position errors, RF electric field sensing, magnetic resonance sensing, laser scanning, sensing with photo detector arrays, motor operation sensing, arm position sensing, or any sensors related to the operation and service. Furthermore, the sensors provides the status and locations of the robot assembly, thus allowing the optimum utilization of the remaining operative part of the assembly, plus the alerting the operator for servicing the inoperative parts of the assembly.

In an embodiment, the compartments are sealed, preferably individually sealed. Sealed compartments allow the emergency removal without contaminating the remaining workpieces due to the emergency access. Sealed compartments further prevent the cross contamination between compartments, since the compartments are sealed against each other. With sealed compartments, in the events of failures, the stocker can be opened to remove the compartments. The sealed compartments are preferably removable for ease of transport.

Sealed compartments might delay access during normal operation, since the compartment doors will need to be open and close for every workpiece access. Thus in an embodiment, the compartments are designed to be opened during normal operations, thus providing improved throughput and ease of accessing the workpieces.

In one aspect, the compartments can be sealed when the workpieces are not being accessed. A sealed compartment can be open when a workpiece reaches the compartment, or when a robot handler approaches the compartment, either for storing or for picking a workpiece. For better throughput, a controller can keep track of the operations, the movement of the workpieces and the requirements of the compartments, and thus can open the sealed compartments before the compartments need to be opened. The compartments can be open way ahead of time, or can be open just a little before the needed time.

In another aspect, the compartments can be sealed during emergency operation. The compartments are opened under normal operating conditions, and are close or sealed when a failure condition is detected. Also, the compartments can be sealed before accessing the emergency removal of the compartment. The system can comprise automatic or manual sealing mechanism for isolating the individual compartments. The system then can initiate the sealing mechanism automatically when detecting a failure condition. Or an operator can initiate a sealing or closing of the compartments before accessing the stocker storage area.

The stocker system can include rotatable carousel for accessing all the compartments. The system can also include opening or moving mechanism for accessing inner compartments. The system can comprise emergency removal equipment to facilitate the removal of the compartments. A compartment can store hundred or so workpieces, thus can be heavy. Further, for small footprint, the compartments might be stacked several shelves high, and thus it is difficult for human access.

The present invention may also be embodied in a machine or computer readable format, e.g., an appropriately programmed computer, a software program written in any of a variety of programming languages. The software program would be written to carry out various functional operations of the present invention. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g. a processor.

With reference to FIG. 13, an exemplary environment 300 for implementing various aspects of the invention includes a computer 301, comprising a processing unit 331, a system memory 332, and a system bus 330. The processing unit 331 can be any of various available processors, such as single microprocessor, dual microprocessors or other multiprocessor architectures. The system bus 330 can be any type of bus structures or architectures, such as 12-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), or Small Computer Systems Interface (SCST).

The system memory 332 can include volatile memory 333 and nonvolatile memory 334. Nonvolatile memory 334 can include read only memory (ROM), programmable ROM (PROM), electrically programmable ROM (EPROM), electrically erasable ROM (EEPROM), or flash memory. Volatile memory 333, can include random access memory (RAM), synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), or direct Rambus RAM (DRRAM).

Computer 301 also includes storage media 336, such as removable/nonremovable, volatile/nonvolatile disk storage, magnetic disk drive, floppy disk drive, tape drive, Jaz drive, Zip drive, LS-100 drive, flash memory card, memory stick, optical disk drive such as a compact disk ROM device (CD-ROM), CD recordable drive (CD-R Drive), CD rewritable drive (CD-RW Drive) or a digital versatile disk ROM drive (DVD-ROM). A removable or non-removable interface 335 can be used to facilitate connection.

The computer system 301 further can include software to operate in environment 300, such as an operating system 311, system applications 312, program modules 313 and program data 314, which are stored either in system memory 332 or on disk storage 336. Various operating systems or combinations of operating systems can be used.

Input devices 322 can be used to enter commands or data, and can include a pointing device such as a mouse, trackball, stylus, touch pad, keyboard, microphone, joystick, game pad, satellite dish, scanner, TV tuner card, sound card, digital camera, digital video camera, web camera, and the like, connected through interface ports 338. Interface ports 338 can include a serial port, a parallel port, a game port, a universal serial bus (USB), and a 1394 bus. The interface ports 338 can also accommodate output devices 321. For example, a USB port may be used to provide input to computer 301 and to output information from computer 301 to an output device 321. Output adapter 339, such as video or sound cards, is provided to connect to some output devices such as monitors, speakers, and printers.

Computer 301 can operate in a networked environment with remote computers 324. The remote computers 324, shown with a memory storage device 325, can be a personal computer, a server, a router, a network PC, a workstation, a microprocessor based appliance, a peer device or other common network node and the like, and typically includes many or all of the elements described relative to computer 301. Remote computers 324 can be connected to computer 301 through a network interface 323 and communication connection 337. Network interface 323 can be communication networks such as local-area networks (LAN) and wide area networks (WAN). LAN technologies include Fiber Distributed Data Interface (FDDI), Copper Distributed Data Interface (CDDI), Ethernet/IEEE 1202.3, Token Ring/IEEE 1202.5 and the like. WAN technologies include, but are not limited to, point-to-point links, circuit switching networks like Integrated Services Digital Networks (ISDN) and variations thereon, packet switching networks, and Digital Subscriber Lines (DSL).

FIG. 14 is a schematic block diagram of a sample computing environment 40 with which the present invention can interact. The system 440 includes a plurality of client systems 441. The system 440 also includes a plurality of servers 443. The servers 443 can be used to employ the present invention. The system 440 includes a communication network 445 to facilitate communications between the clients 441 and the servers 443. Client data storage 442, connected to client system 441, can store information locally. Similarly, the server 443 can include server data storages 444.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

What is claimed is:

1. A method for improving the operation of a workpiece stocker, wherein the workpiece stocker comprises stored workpieces, the method comprising:
    installing an enclosure at an emergency access port of the workpiece stocker in the event of a failure of the stocker, wherein the enclosure is linked to the workpiece stocker to enable accessing the workpieces;
    opening the emergency access port;
    removing the workpieces from the workpiece stocker to the enclosure; and
    closing the emergency access port, wherein the workpiece are removed from the workpiece stocker without exposing other workpieces in the workpiece stocker to outside ambient.

2. A method as in claim 1 wherein the enclosure comprises a portable clean room for linking with the workpiece stocker.

3. A method as in claim 1 wherein the enclosure comprises a load lock for the emergency access port.

4. A method as in claim 1 wherein an operator stays outside the enclosure while handling the workpieces.

5. A method as in claim 1 wherein the enclosure comprises a portable glove box for accessing the workpieces.

6. A method as in claim 1 wherein an operator enters the workpiece stocker through the emergency access port to handle the workpieces.

7. A method as in claim 1 wherein the workpieces are stored in carrier boxes in the workpiece stocker.

8. A method as in claim 1 wherein the workpieces are stored bare in the workpiece stocker.

9. A method as in claim 8 further comprising
storing the workpieces in a container box before removing from the workpiece stocker.

10. A method for improving the operation of a workpiece stocker, wherein the workpiece stocker comprises stored workpieces in individual compartments, wherein the individual compartments are removable from the workpiece stocker, the method comprising:
establishing a clean environment at an emergency access port of the workpiece stocker;
accessing the emergency access port of the workpiece stocker in the event of a failure of the stocker to access the individual compartments, wherein the clean environment enables accessing the emergency access port without contaminating the workpieces in the workpiece stocker; and
removing the individual compartments from the workpiece stocker.

11. A method as in claim 10 wherein establishing a clean environment at an emergency access port comprising
installing an enclosure at the emergency access port, wherein the enclosure comprises a portable clean room or a portable glove box.

12. A method as in claim 10 wherein establishing a clean environment at an emergency access port comprising
installing an enclosure for the emergency access port, wherein the enclosure comprises a load lock.

13. A method as in claim 10 wherein an operator stays outside the workpiece stocker while handling the workpieces.

14. A method as in claim 10 wherein an operator enters the workpiece stocker through the emergency access port to handle the workpieces.

15. A method as in claim 10 wherein the workpieces are stored in carrier boxes in the workpiece stocker.

16. A method as in claim 10 wherein the workpieces are stored bare in the workpiece stocker, the method further comprising
storing the workpieces in a container box before removing from the workpiece stocker.

* * * * *